United States Patent
Kasa et al.

(10) Patent No.: US 6,310,805 B1
(45) Date of Patent: Oct. 30, 2001

(54) ARCHITECTURE FOR A DUAL-BANK PAGE MODE MEMORY WITH REDUNDANCY

(75) Inventors: Yasushi Kasa, Kawasaki (JP); Ming-Huei Shing, Cupertino, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/676,902

(22) Filed: Oct. 2, 2000

Related U.S. Application Data
(60) Provisional application No. 60/187,657, filed on Mar. 7, 2000.

(51) Int. Cl.$^7$ ................................................ G11C 7/00
(52) U.S. Cl. .......................... 365/200; 365/63; 365/196; 365/230.06
(58) Field of Search ................................ 365/230.03, 63, 365/200, 189.05, 230.06, 238.5, 195, 196, 189.02

(56) References Cited

U.S. PATENT DOCUMENTS

| | | |
|---|---|---|
| 5,349,558 | 9/1994 | Cleveland et al. . |
| 5,748,561 * | 5/1998 | Hotta .................................. 365/238.5 |
| 5,784,321 * | 7/1998 | Yamamura .......................... 365/200 |
| 6,094,381 * | 7/2000 | Isa ....................................... 365/200 |
| 6,195,299 * | 2/2001 | Sugibayshi ......................... 365/200 |

OTHER PUBLICATIONS

AMD publication titled, "3.0 Volt–only Page Mode Flash Memory Technology", Technology Background, AMD Publication, dated Oct. 1998, pp 1–7.

AMD publication titled, "Am29DL400B 4 Megabit (512 K × 8–Bit/256 K × 16–Bit) CMOS 3.0 Volt–only, Simultaneous Flash Memory", AMD Publication No. 21606, dated Mar. 23, 1999, pp 1–41.

U.S.applicationl No. 09/676,623 Filed: Oct. 2, 2000—Copy of application as filed in the PTO enclosed.

* cited by examiner

*Primary Examiner*—David Nelms
*Assistant Examiner*—Gene N. Auduong

(57) ABSTRACT

A memory circuit (100) includes address circuitry (104) configured to receive address data and a plurality of I/O buffers (112). A core cell array (102) includes core cells and redundant core cells. Sense amplifiers (108) including read sense amplifiers (132) and redundant sense amplifiers may be coupled to the I/O buffers by word selection circuitry (110). Redundancy is implemented on an I/O-by-I/O basis, so that a redundant core cell and sense amplifier may be substituted for any failed bit in the core cell array.

11 Claims, 11 Drawing Sheets

ARCHITECTURE FOR A DUAL-BANK PAGE MODE MEMORY WITH REDUNDANCY

This application claims benefit of Provisional No.60/187,657 filed Mar. 7, 2000.

BACKGROUND OF THE INVENTION

The present invention relates generally to semiconductor memory circuits. More particularly, the present invention relates to an architecture for a dual-bank page mode memory with redundancy.

Semiconductor memory circuits provide storage of large amounts of data and ready access to stored data A memory circuit consists of an array of core cells. Each core cell stores one or more bits of data. The core cells are each individually addressable by a unique combination of address inputs to the memory circuit. The address circuits are located in the periphery of the memory circuit, along with sense amplifiers which detect the logical state of the data in an addressed core cell. The sense amplifiers provide the detected data to an I/O circuit for external communication. A row address is provided along a word line and a column address is provided to the sense amplifiers to select the proper bit line of the addressed core cell. In some technologies, the data in the core cells may be written as well as read by peripheral circuits of the memory.

Semiconductor memories provide a large number of features to enhance convenience for the user. Page mode operation has been developed to reduce read access times by accessing a page of data from the core cell array and reading the data from the accessed page. Page access time to read the data from the page may be as little as one-third the initial access time needed to read the data from the core cell array. Dual-bank memories permit simultaneous read and write operations. In such memories, the host system can program data in one bank, then immediately and simultaneously read from the other bank, with zero latency between the read and write operations. Another convenience feature is byte-wide or word-wide data input/output circuits, in which eight bits or 16 bits of data are written or read by the memory circuit at one time.

To reduce manufacturing defects and improve the manufacturing yield for semiconductor memories, redundant designs have been developed to replace defective bits in the core cell array. The array is designed with additional redundant core cells which may be switched in to take the place of a defective core cell. In addition, redundant sense amplifiers are included to detect the data stored in the redundant core cells and provide the data to an output circuit.

In conventional redundancy circuits, when a defective core cell must be replaced, an entire redundant byte or word is switched into the circuit. This is done instead of switching a single redundant bit to replace the single failing bit at one I/O circuit of the byte or word selected. Thus, other bit lines of the same address, different I/O circuit, will be replaced even though they don't have defects. This is wasteful of area or real estate on the memory circuit. However, this conventional technique simplifies the circuit design and the wasted area can be made negligible if the memory is not a page mode design. Conventional redundancies are based on sectorization of the memory.

In page mode designs, however, the wiring interconnections necessary to implement redundancy become significant. Moreover, if a dual-bank capability is added to the page mode design, an area-efficient design is not readily available for implementing redundancy on the memory circuit Accordingly, there is a need for an improved memory circuit which provides the advantages of redundant core cells with the convenience of page mode operation and with dual-bank design.

BRIEF SUMMARY OF THE INVENTION

By way of introduction only, a memory circuit in accordance with the present invention provides redundancy in a page mode device configured as a dual-bank memory. The memory circuit includes an array of core cells including redundant core cells. Sense amplifiers are associated with each column of core cells and redundant core cells. Word selection circuitry couples sense amplifiers to input/output (I/O) buffers of the memory circuit on an I/O-by-I/O basis. Any bit of any word on a page can be individually replaced by the word selection circuitry.

The foregoing discussion of the preferred embodiments has been provided only by way of introduction. Nothing in this section should be taken as a limitation of the following claims, which define the scope of the invention.

DETAILED DESCRIPTION OF THE PRESENTLY PREFERRED EMBODIMENTS

Figure 1:
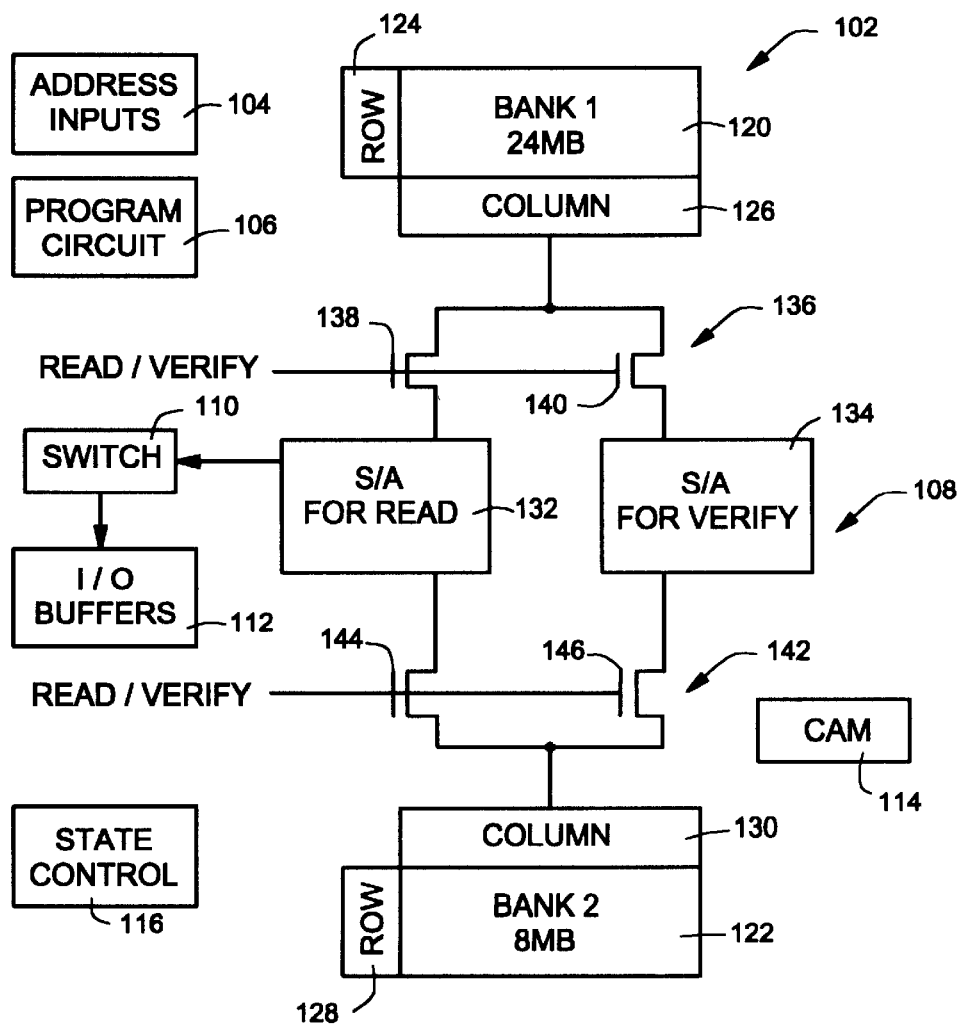
FIG. 1 is a block diagram of a memory circuit.

Referring now to the drawing, FIG. 1 is a block diagram of a memory circuit 100. The memory circuit 100 includes a core cell array 102, address inputs 104, a programming circuit 106, sense amplifiers 108, a switch 110, input/output (I/O) buffers 112, a content addressable memory 114 and a state control circuit 116. In the illustrated embodiment, the memory circuit 100 is a flash memory chip providing 32 MB of data storage. However, in alternative embodiments, the memory circuit 100 could be a dynamic or static random access memory (DRAM or SRAM), other non-volatile or other type of memory device. Still further, the memory circuit 100 could be a self-contained integrated circuit or be embedded in an integrated circuit providing other functionality.

The memory circuit 100 is a page mode device which provides page mode access to data stored in the memory. The address inputs 104 form address circuitry configured to receive address data. When an address is provided to the address inputs 104, a page of data including four 16-bit words is accessed in the core cell array 102. The accessed data are presented one word at a time at the I/O buffers 112. Thus, the I/O buffers 112 form output circuitry configured to provide a predetermined number of bits, such as 16 bits, of stored data from the memory circuit 100. By changing the address at the address inputs 104, a different word of the accessed page may be read at the I/O buffers 112. Similarly, data may be written or programmed at individually selected addresses of the core cell array 102 using the program circuit 106. Other word and page sizes may be substituted. Operations such as reading, programming and verifying programmed data are controlled by the state control circuit 116.

In the illustrated embodiment, the core cell array 102 is divided into two banks, including a first bank or upper bank 120 and a second bank or lower bank 122. Dual-bank configuration allows simultaneous read and write. That is, data may be written to one of the first bank 120 and the second bank 122 while, simultaneously, data is being read from the other of the first bank 120 and the second bank 122. Each bank includes addressing circuitry. The first bank 120 includes a row decoder or X decoder 124 and a column decoder or Y decoder 126. Similarly, the second bank 122 includes a row decoder or X decoder 128 and a column decoder or Y decoder 130. In response to address signals received at the address inputs 104, appropriate signals are generated by the row decoders and column decoders to uniquely access a page including four words in the core cell array of 102.

The sense amplifiers 108 include read sense amplifiers 132 and verify sense amplifiers 134. A switch circuit 136 including a first transistor 138 and a second transistor 140 couples the sense amplifiers 132, 134 to the first bank 120. Similarly, a switch circuit 142 including transistor 144 and transistor 146 couples the sense amplifiers 132, 134 to the second bank 122. The switch circuits 136, 142 respond to a signal labeled read/verify for selecting the sense amplifiers to be coupled to core cells for reading. The switch circuit may be as illustrated in FIG. 1 or may include other circuitry and functionality as well The read/verify signal is provided under control of the state control circuit 116.

Following programming of a word of core cells, the read/verify signal is forced to its verify state, coupling the verify sense amplifiers 134 to the core cell array. In the illustrated embodiment, the verify sense amplifiers 134 include 16 sense amplifiers for sensing a single word of data stored in the core cell array. If the stored data match the data that was programmed by the programming circuit 106, the storage operation is verified.

Otherwise, for conventional reading operations from the memory circuit 100, the read/verify circuit is placed in its read state, coupling the read sense amplifiers 132 to the core cell array. In the illustrated page mode device of FIG. 1, the read sense amplifiers 132 include 64 sense amplifiers for reading four 16-bit words of a page. The four words are provided to the switch 110 which, in response to the address at the address inputs 104, selects one word to be conveyed to the I/O buffers 112.

As will be described in further detail below, the core cell array 102 includes redundant core cells which may be activated to replace failing core cells of the core cell array 102. Use of redundant core cells reduces the overall cost of the memory circuit 100 by improving manufacturing yields or the percentage of good circuits produced in a manufacturing run. For accessing the redundant core cells, the sense amplifiers 108 include redundant sense amplifiers. The locations of failing bits are identified during a test operation of the memory circuit 100.

These locations are stored in the content addressable memory 114. The content addressable memory 114 is accessed during operation of the memory circuit 100 to determine if a redundant core cell and sense amplifier should be switched in place of an addressed core cell.

Other connections and circuitry of the memory circuit 100 are not illustrated in FIG. 1 so as not to unduly complicate the drawing figure. Such circuitry and connections may be readily identified by those ordinarily skilled in the art. Further, alternative embodiments and organizations may be readily substituted for the embodiment illustrated in FIG. 1.

Figure 2:
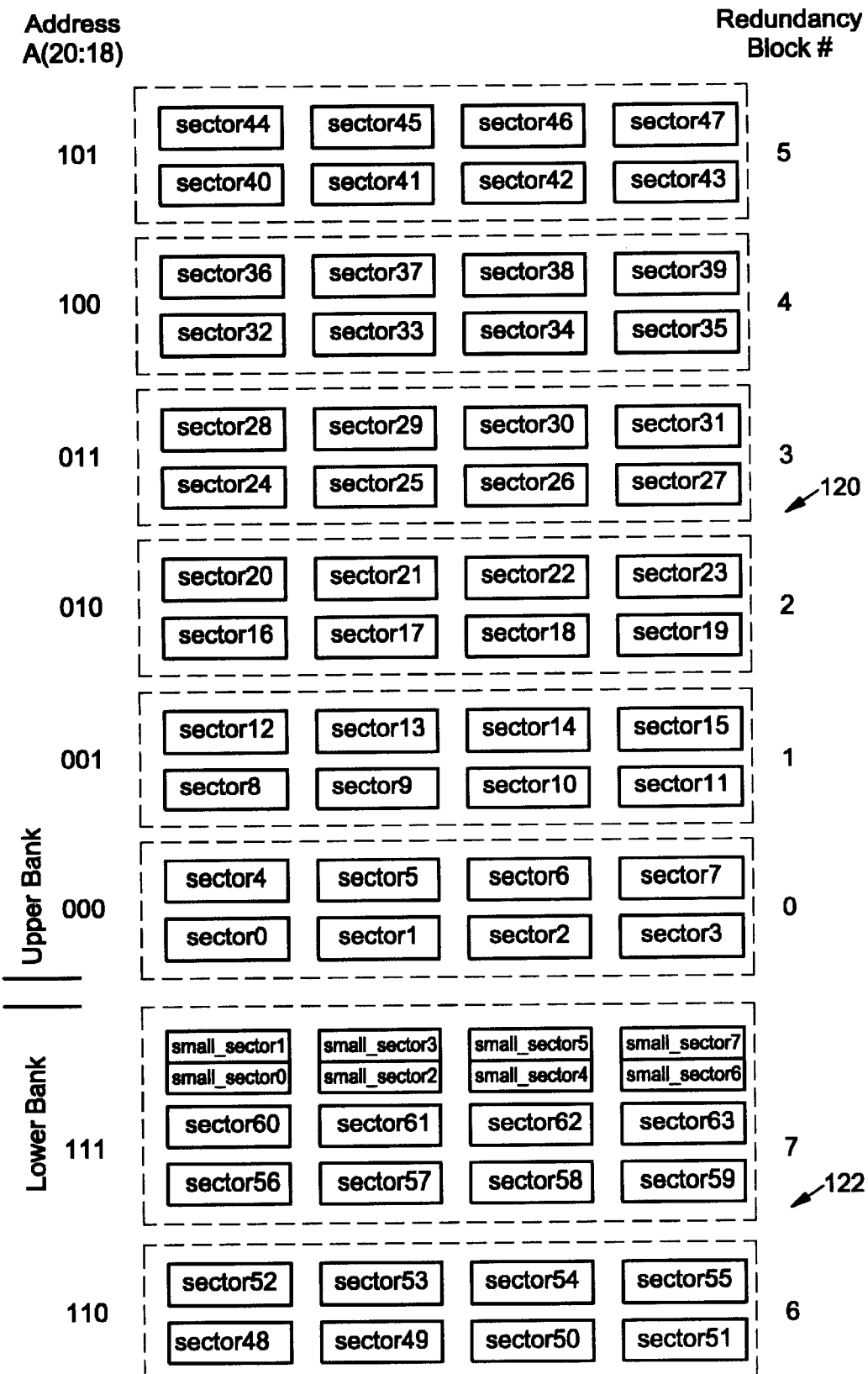
FIG. 2 illustrates arrangement of the core cell array of the memory circuit of FIG. 1.

FIG. 2 illustrates the core cell array 102 of the memory circuit 100 of FIG. 1. The core cell array 102 includes an upper bank 120 and a lower bank 122.

In the illustrated embodiment, the lower bank 122 is 8 MB in size and the upper bank 120 is 24 MB in size. Each bank includes a plurality of sectors. In the illustrated embodiment, each sector is 64 KBytes in size. In the lower bank 122, some of the sectors are configured as small sectors. Each small sector in the illustrated embodiment is 8 KBytes.

The configuration of the core cell array 102 is illustrative only. Other suitable organizations or arrangements, and other suitable bank and sector sizes, may be substituted as appropriate.

Figure 3:
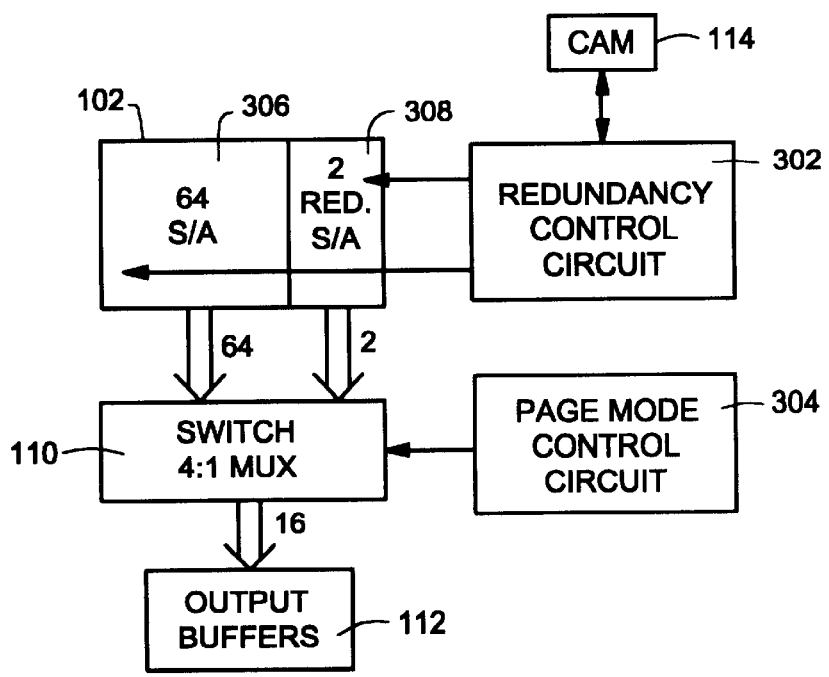
FIG. 3 is a block diagram illustrating a portion of the memory circuit of FIG. 1.

FIG. 3 shows a portion of the memory circuit 100 of FIG. 1. FIG. 3 illustrates the interaction of the core cell array 102 and a redundancy control circuit 302, along with the word selecting switch 110 and a page mode control circuit 304. In FIG. 3, the sense amplifiers 102 are illustrated as a block of sense amplifiers 306 and redundant sense amplifiers 308. In the embodiment of FIG. 3, there are 64 sense amplifiers 306, corresponding to the 64 bits of a page to be read from the core cell array. Associated with the 64 sense amplifiers 306 are two redundant sense amplifiers 308.

The redundancy control circuit 302 controls the replacement of sense amplifiers 306 with the redundant sense amplifiers 308. Replacement is made according to data stored in the content addressable memory 114. When a storage location corresponding to one of the sense amplifiers 306 is selected by the address data provided to the memory circuit, the redundancy control circuit 302 detects this selection and substitutes a redundant sense amplifier 308 for the sense amplifier 306. The sense amplifiers 102 are coupled to the switch circuit 110. The outputs of the sense amplifiers 306 are provided to the switch circuit 110 along with the outputs of the redundant sense amplifiers 308. The switch circuit 110 operates as a 4:1 multiplexer to select one word 16 bits wide to be provided to the output buffers 112. The page mode control circuit 304 provides a control signal to the switching circuit 110 to control selection of the word to be presented to the output buffers 112. The control signal is generated in response to address data provided to the memory circuit.

Figure 4:
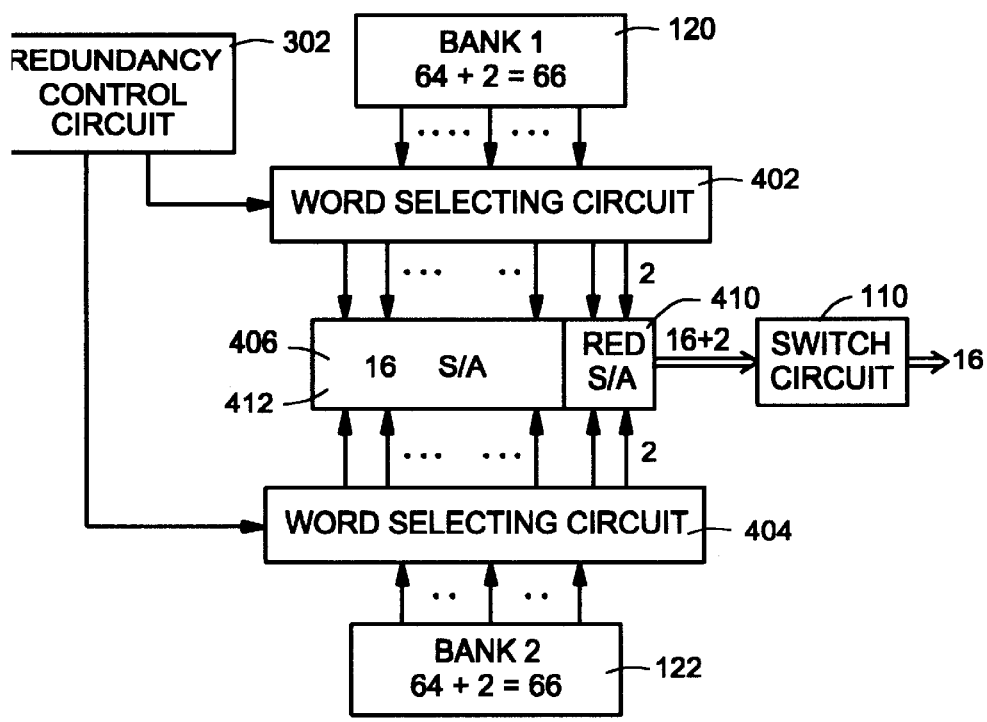
FIG. 4 is a block diagram illustrating a portion of the memory circuit of FIG. 1.

FIG. 4 illustrates extension of the architecture of FIG. 3 to a dual-bank memory. Here, the core cell array is divided into a first or upper bank 120 and a second or lower bank 122. Each bank of core cells is 64 columns wide, plus two columns of redundant core cells. Word selecting circuitry 402 associated with the upper bank 120 selects 16 columns of the 66 total columns of the upper bank 120 and provides them to a column sense amplifier block 406. Word selecting circuitry 404 associated with the lower bank 122 similarly selects 16 columns of the 66 columns of the second or lower bank 122. The word selecting circuits 402, 404 are controlled by selecting signals provided by a redundancy control circuit 302.

The sense amplifiers 406, including conventional sense amplifiers 412 and redundant sense amplifiers 410 receive the selected word and redundant bits from the word selecting circuit 402, 404. The sense amplifiers 406 detect the state of the core cells which have been coupled to the sense amplifiers 406 and provide output data to the switch circuit 110. The switch circuit 110 controls the replacement of data from a conventional sense amplifier 412 with data from a redundant sense amplifier 410. Thus, the switch circuit 110 receives a total of 18 data signals but provides 16 of the 18 data signals to the output buffer.

In accordance with the present embodiments, the redundant core cells and the redundant sense amplifiers replace bit lines which contain failed bits. Each bit line corresponds to a column of the core cell array. Rows of the core cell array are accessed by activating the word line of the row by the X decoder. This turns on the transistors of the accessed core cells. Along the selected column, as decoded by the Y decoder, current from the core cell flows in the bit line and in the sense amplifier. The sense amplifier detects the current to sense the logical state of the data stored in the selected core cell.

Previous redundancy techniques replaced bit lines of the same address for all I/O. Each I/O corresponds to a bit of the input/output word. A word-wide device has 10 I/O labeled in one example as $DQ_0$ through $DQ_{15}$. Thus, previous redundant circuits for word-wide outputs replaced a conventional word with an entire redundant word, even when only a single bit of the word fails. Other bit lines of the same address, different I/O, are replaced even though they don't have defects.

In a page mode device such as the memory circuit 100 of the illustrated embodiment, however, such a circuit is inefficiently large. The circuitry including control signals necessary to replace an entire word or page when a single bit fails is too large to efficiently be implemented in an integrated circuit. Accordingly, a better alternative is required.

Accordingly, the present embodiments illustrate I/O based redundancy in a memory circuit Only a specified I/O is replaced which contains a defect. Switching circuit de-selects the failing bit line and selects instead a redundant bit line. The redundant bit line is switched in place of the defective bit line to replace failing bits on an I/O by I/O basis Bit lines of other non-defective I/O are not replaced.

Similarly, the present embodiments illustrate I/O plus word based redundancy. The core cell array of the illustrated embodiment is divided into a plurality of sectors. Each sector is associated with one I/O and many sectors together may be associated with one I/O. Since the memory is a page mode memory, each page includes multiple bits to be read for each I/O during a page read. In accordance with the redundancy scheme of the present embodiments, redundant bits in a sector associated with any word may be switched to replace failing bits of any other sector, regardless of the word association of the failing bit.

Figure 5A:
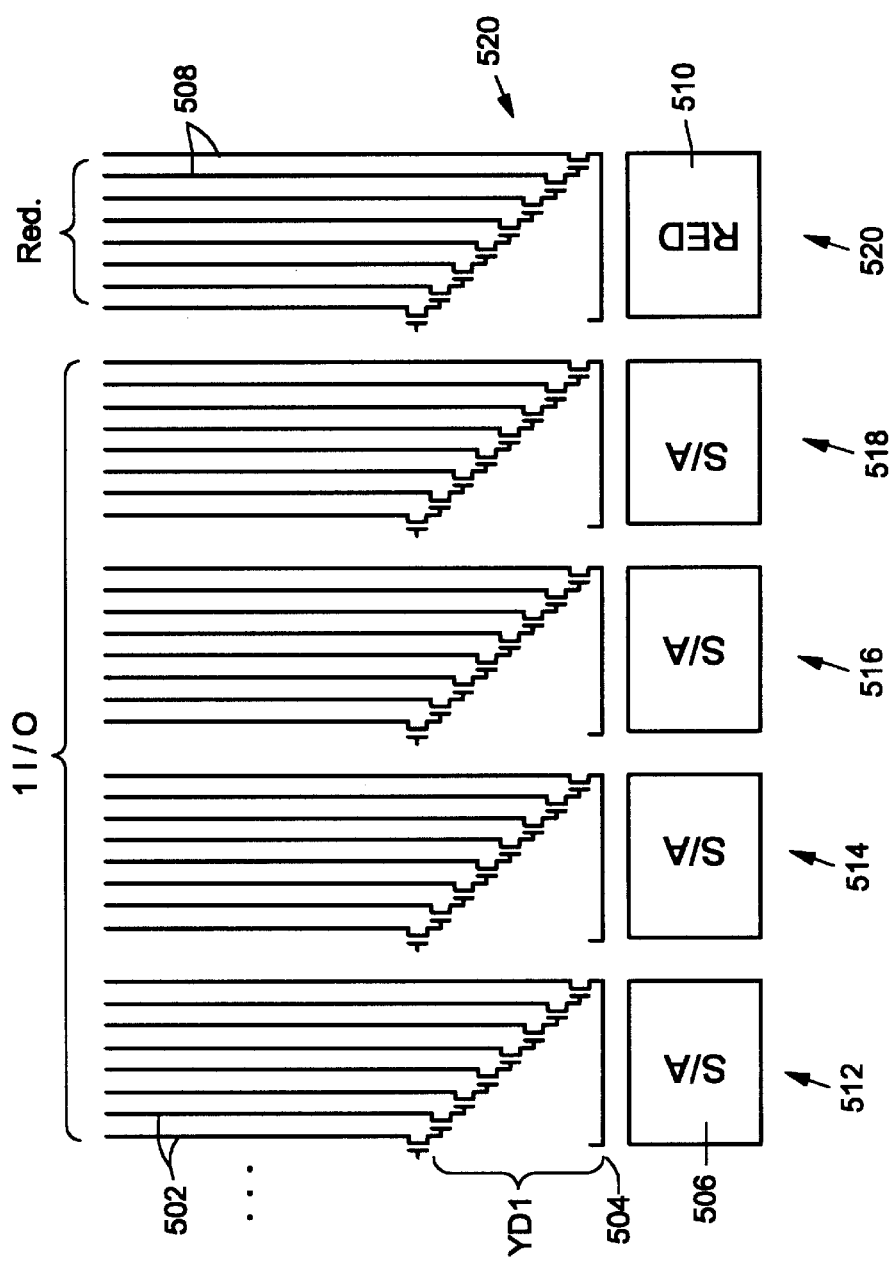
FIG. 5A & FIG. 5B is a block diagram illustrating a portion of the memory circuit of FIG. 1.
Figure 5B:
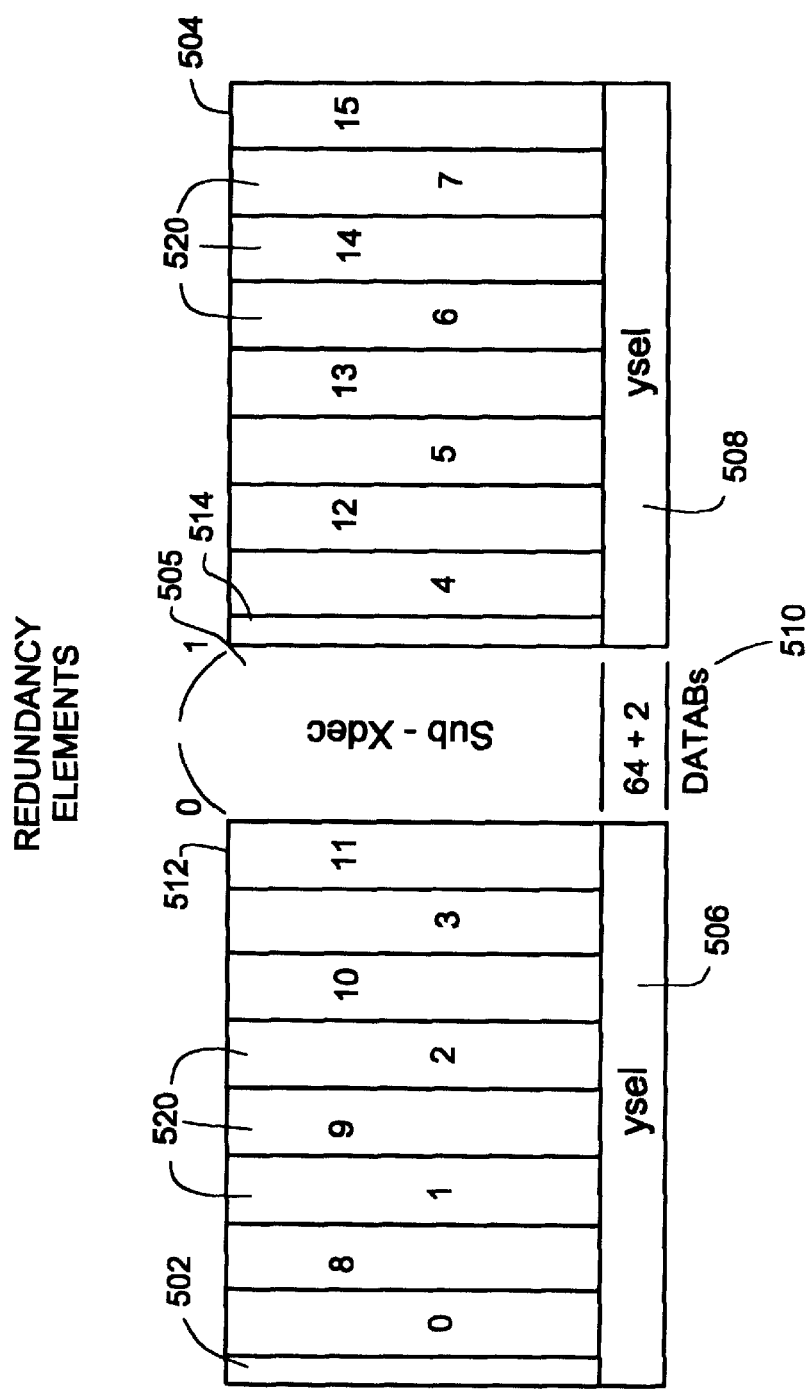

FIG. 5A & FIG. 5B illustrates organization of one sector 500 of the core cell array 102 of the memory circuit 100 of FIG. 1. The sector 500 includes two blocks of core cells, including a block 502 and a block 504. Positioned between the two blocks 502, 504, is a sub-x decoder 505. The sub-x decoder 505 selects a unique word line corresponding to a single row of the sector in response to the address inputs provided to the memory circuit. The sub-x decoder 505 responds to signals provided by the global-x decoder or row decoder of the core cell array 102.

The sector 500 further includes Y selectors 506, 508 which decode the address data at the address inputs of the memory circuit to select the addressed columns of the core cell array. The addressed columns are selected by activating the sense amplifiers associated with those columns and coupling the output of the sense amplifiers to a data bus 510. The blocks 502, 504 are composed of segments 520 of core cells and sense amplifiers. Each segment 520 is associated with one I/0 and is labelled accordingly. Thus, if the I/O pins of the memory circuit 100 are labelled $DQ_n$ for $0 \leq n \leq 15$, the segment 520 labelled 0 in FIG. 5B corresponds to I/O $DQ_0$ and the segment 520 labelled 15 in FIG. 5 corresponds to $DQ_{15}$.

The sector 500 further includes redundancy elements 512, 514 labeled 0 and 1 in FIG. 5B. The data bus 510 includes 64 signal lines, one for each of the sense amplifiers, plus two redundant signal lines, one for each of the redundancy elements. The data on the data bus 510 is output from the sense amplifiers and redundant sense amplifiers and has conventional digital logic levels.

Figure 6:
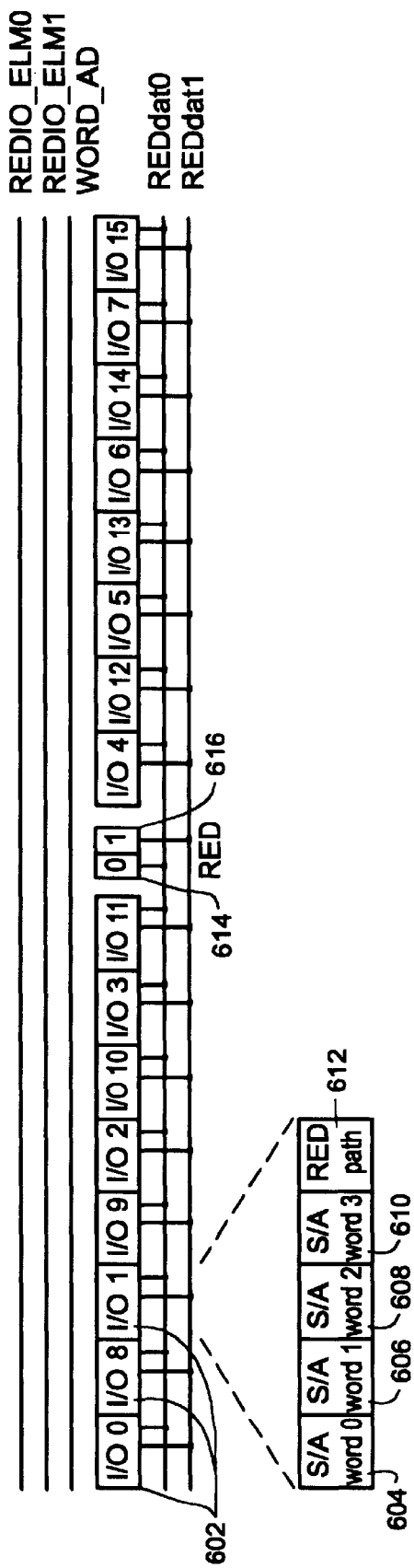
FIG. 6 is a block diagram illustrating a portion of the memory circuit of FIG. 1.

FIG. 6 illustrates a sense amplifier switch circuit 600 for use in the memory circuit of FIG. 1. The switch circuit 600 includes a plurality of switch groups 602. Each switch group 602 is associated with an I/O buffer of the memory circuit. Switch group 602 includes four sense amplifier switches 604, 606, 608, 610 and a redundancy path 612. The sense amplifier switches include a switch 604 for word 0 of the page, switch 606 for word 1 of the page, switch 608 for word 2 of the page, and switch 610 for word 3 of the page. The redundancy path 612 contains circuitry for selecting the redundancy elements. Structure and operation of the I/O switch group 602 will be described in further detail in conjunction with FIGS. 7 and 8.

FIG. 6 further shows positioning of redundant sense amplifiers. A first redundant sense amplifier 614 is associated with a first redundancy element 512 (FIG. 5B) and a second redundant sense amplifier 616 is associated with redundancy element 514 (FIG. 5B).

Further, control signals are provided adjacent to the switches 602 group and the redundant sense amplifiers. The control signal labeled REDIO_ELM0 and the control signal labeled REDIO_ELM1 indicate which bit of the switch is to be replaced by the redundancy elements 512, 514. The control signal WORD_AD is a four-bit signal which selects one switch group 602 of the 16 switch groups. The signal labeled REDdat0 and REDdat1 are the sense amplifier output signals of the redundancy elements 512, 514.

Figure 7:
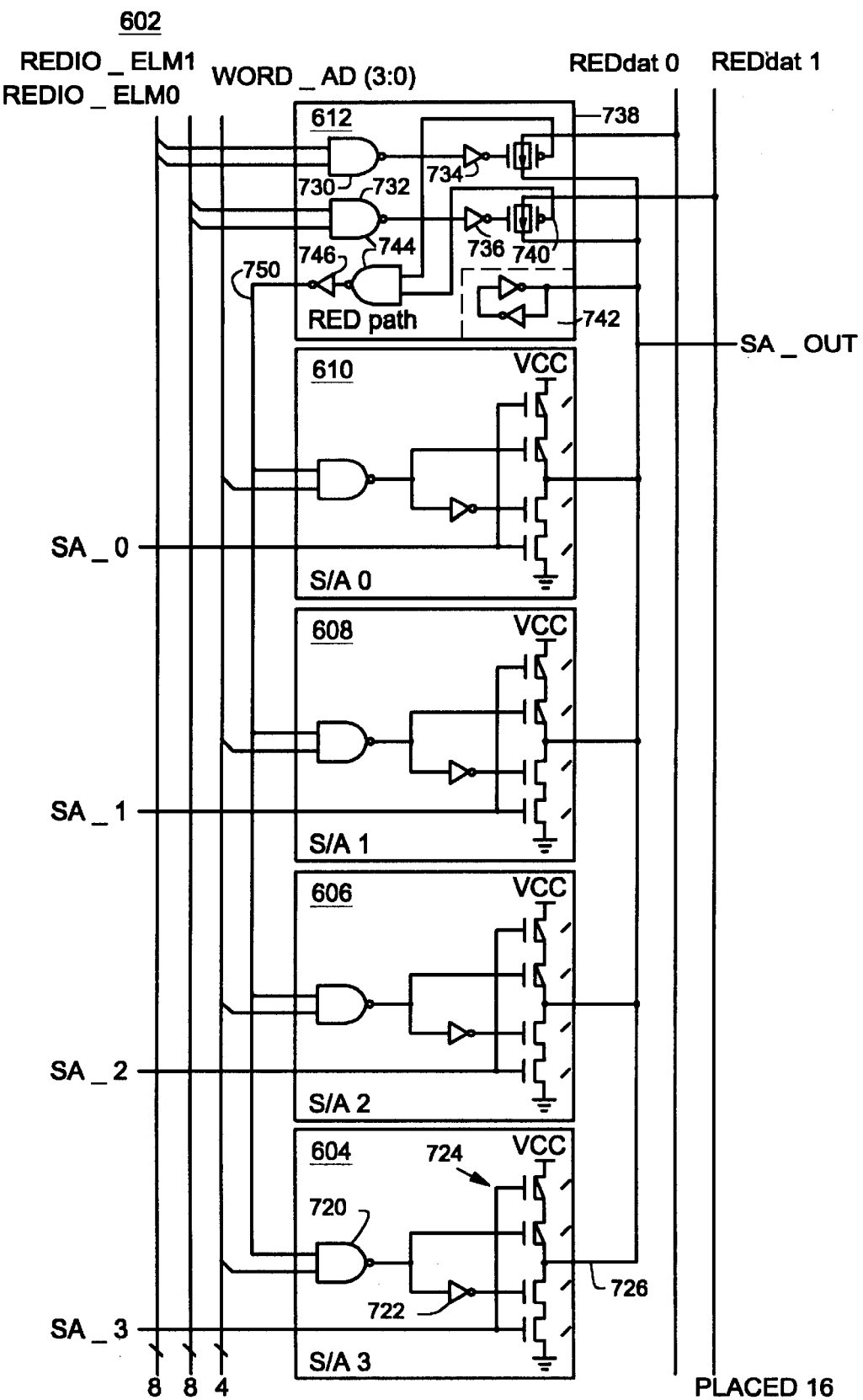
FIG. 7 is a block diagram illustrating a portion of the memory circuit of FIG. 1.

FIG. 7 shows in detail a switch group 602 of FIG. 6. In FIG. 7, the switch group 602 includes a first sense amplifier switch 604, a second sense amplifier switch 606, a third sense amplifier switch 608 and a fourth sense amplifier switch 610. Further, the switch group 602 includes a redundancy selector circuit 612. The four sense amplifier switches 604, 606, 608, 610, are all substantially identical. They differ only in the interconnections at their respective inputs and outputs.

Each of the sense amplifiers switches 604, 606, 608, 610 receives a sense amp output signal from a sense amplifier associated with the switch group 602.

The sense amplifier switch 604 receives signal SD_3. Sense amplifier switch 606 receives signal SD_2. Sense amplifier switch 608 receives signal SD_1. Sense amplifier switch 610 receives signal SD_0. Each sense amplifier switch 604, 606, 608, 610 has an output coupled to a node labeled SD_OUT in FIG. 7. Referring to sense amp switch 604, each sense amp switch 604, 606, 608, 610 includes a NAND gate 720, an inverter 722 and a transistor circuit 724. The NAND gate 720 has a first input coupled to the output of the redundancy select circuit 612. The NAND gate 720 has a second input coupled to the word address signal labeled WORD_AD in FIG. 7. The transistor circuit 724 includes two p-channel transistors coupled in series between the output 726 of the sense amp circuit 604 and the voltage supply labeled VCC. Further, the transistor circuit includes two n-channel transistors coupled in series between the output 726 and ground. The gates of the outer n-channel and p-channel transistors of the transistor circuit 724 are controlled by the sense amplifier signal SD_n. The gates of the inner n-channel transistors are controlled by the outputs of the inverter 722 and NAND gate 720, respectively. The transistor circuit 724 operates to place the output 726 in a high impedance state when the sense amp switch 704 is not selected.

The redundancy path circuit 612 includes a NAND gate 730, a NAND gate 732 and inverter 734, an inverter 736 a transmission gate 738 and a transmission gate 740. The redundancy path further includes a latch 742, a NAND gate 744 and an inverter 746. The NAND gates 730, 732 receive as inputs the signals labeled REDIO_ELM0 and REDIO_ELM1. These signals indicate which word of I/O is to be replaced by the redundancy element 0 or 1. In response to these input signals, the NAND gates 730, 732 provide control signals to the transmission gates 738, 740, using the inverters 734, 736, to turn on one of the transmission gates 738, 740. The transmission gates, in turn, receive as inputs the signals REDdat 0 and REDdat 1. These signals are the sense amplifier outputs from the redundancy elements 0 and 1. In response to the control signals provided by the NAND gates 730, 732, the transmission gates 738, 740 couple one of the redundant data signals to the signal line labeled SD_OUT in FIG. 7. Further, the redundant path circuit 612 operates to disable one of the sense amplifiers which is 704, 706, 708, 710. In response to the control signals from the NAND gates 730, 732, the NAND gate 744 in conjunction with the inverter 746 provides a control signal on node 750 to disable the output of the sense amplifier switch.

Figure 8:
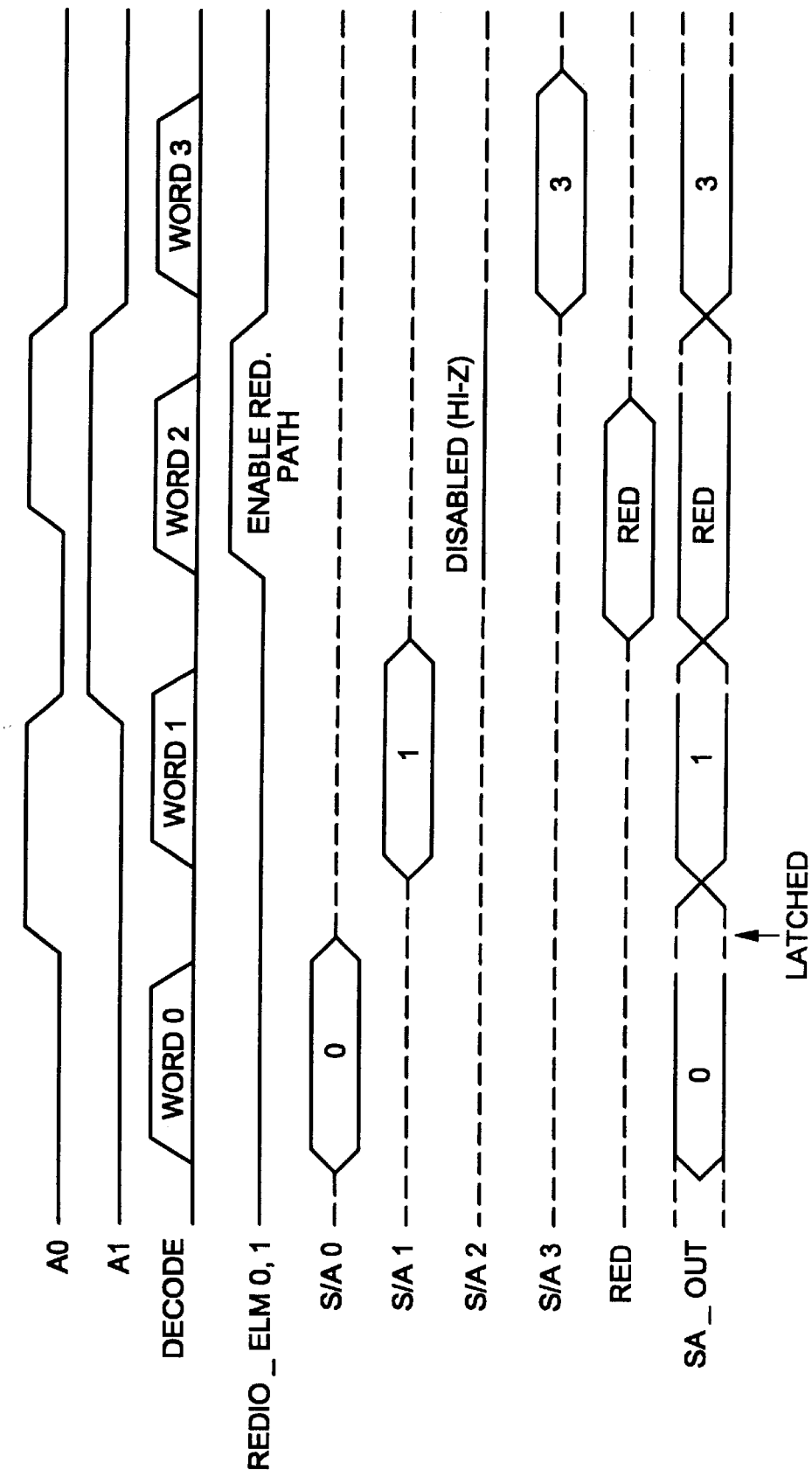
FIG. 8 illustrates a sense amplifier switching circuit for use in the circuit of FIG. 6.

FIG. 8 is a timing diagram illustrating operation of the circuit of FIG. 7. FIG. 8 includes wave forms for address lines A0 and A1, which are used to select one of the four words of the selected page of the page mode memory circuit. The selected word is identified by the signal labeled *decode. The signal labeled REDIO_ELM1,1 in FIG. 8 goes high when the redundancy path circuit 612 (FIG. 7) is enabled. That is, this signal goes high when a redundant core cell and sense amplifier should be switched in in place of failed bit line. Further in FIG. 8, the signals labeled S/A0, S/A1, S/A2, and S/A3 indicate the output signals provided by the switch group 702 of FIG. 7. The signal S/A0 transitions from the high impedance state to a valid logic level when word 0 is selected. Similarly signal S/A1 transitions from high impedance state to valid logic level when word 1 is selected. In contrast, the signal S/A2 remains disabled in the high impedance state, when word 2 is selected because that sense amplifier if being replaced by a redundant circuit. When word 2 is selected, the signal labeled RED assumes a valid logic level and provides the output data for word 2. Subsequently when word 3 is selected, signal S/A3 transitions from the high impedance state to a valid logic level to provide the data for word 3.

As can be seen in FIG. 8, the latch 742 of the redundant path circuit 612 operates to latch the state of the signal SD_OUT (FIG. 7). Latching occurs after the data output signal, labeled SD_OUT in FIG. 8, has assumed a valid state and after the word is no longer selected. Word decode signals, indicated by the wave form labeled decode in FIG. 8, should only be active one at a time in order to avoid any conflict occurring by multiple selection. For this reason there are some moments when no word decode signal is selected. With none selected, this may cause the signal SD_OUT to float, which could result in unexpected changing of the output signal. Therefore, the latch 742 is included to latch the state of the signal SD_OUT.

Figure 9:
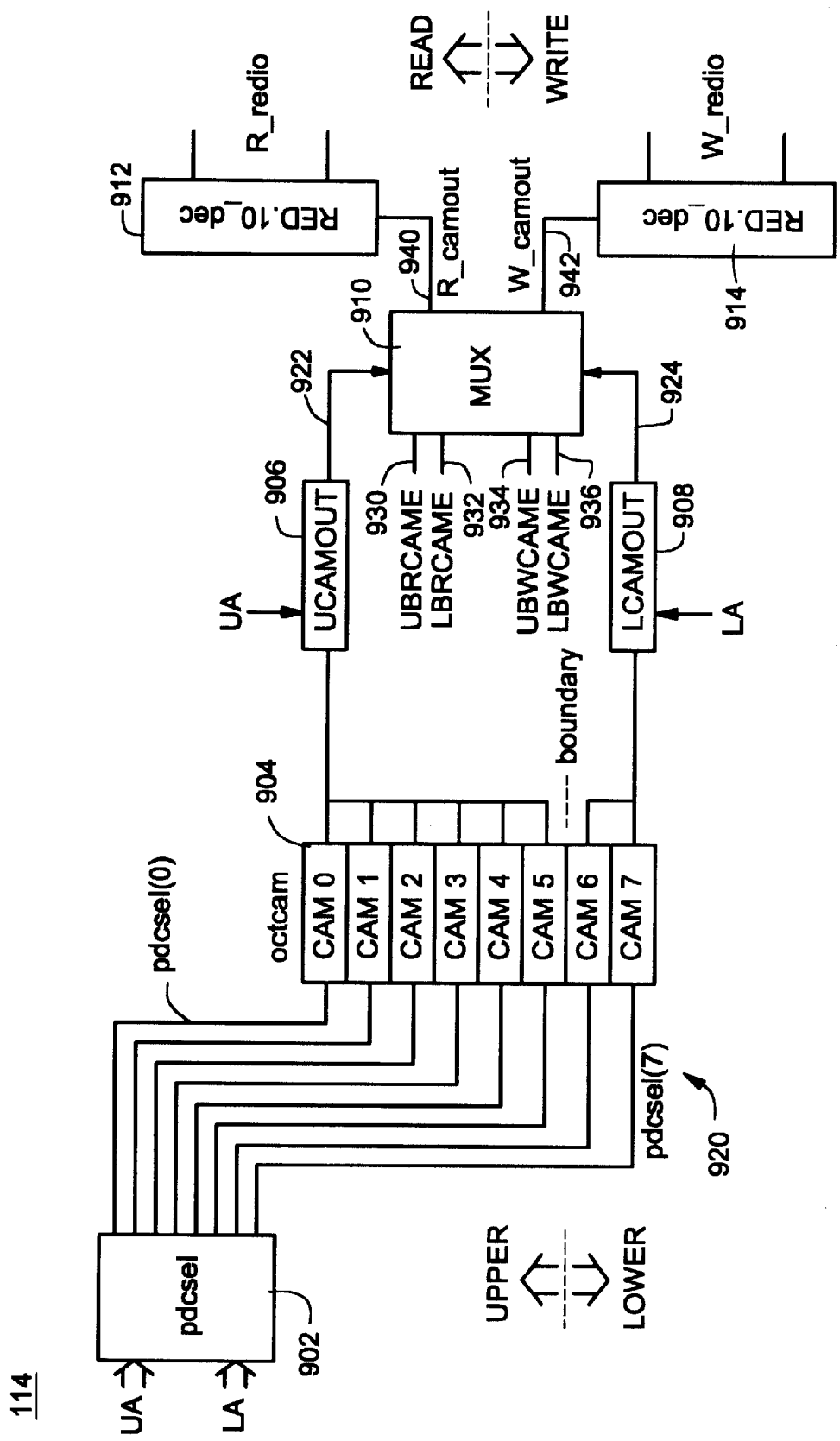
FIG. 9 is block diagram of a first implementation of a content addressable memory circuit for use in the memory circuit of FIG. 1.

FIG. 9 is a block diagram of a content addressable memory (CAM) circuit 114 for use in the memory circuit 100 of FIG. 1. FIG. 9 shows CAM structure for the memory circuit The CAM circuit 114 includes a PDC selector 902, CAM cells 904, an upper bank CAM output circuit 906, a lower bank CAM output circuit 908, a multiplexer 910, a read redundant I/O decoder 912 and a write redundant decoder 914. Since CAMs are assigned by physical sector arrangement, the signal path is arranged as location (upper bank/lower bank) oriented. These signals are converted to read/write signals by the multiplexer 910 for control of the sense amplifiers of the memory circuit 100. The sense amplifiers are related to the read/write operation, so these signals are function oriented.

The PDC selector 902 receives the address supplied to the upper bank UA and the address supplied to the lower bank LA. The memory circuit 100 supports simultaneous operation, meaning that core cells at an address in one bank may be programmed while core cells in the other bank are being read. Separate bank addresses are received during this simultaneous operation.

The PDC selector 902 decodes the CAM cell 904 to be selected. The PDC selector 902 generates an eight bit PDC signal 920, designated pdcsel(0) to pdcsel(7) which is supplied to the CAM cells 904. The eight decoding signals pdcsel(n) activate CAMn, where n=0 to 7.

In the embodiment of FIG. 9, the boundary between the upper bank and the lower bank is set between CAM5 and CAM6. That is, CAM0–CAM5 are associated with the upper bank and CAM 6–CAM7 are associated with the lower bank. As a result, signals pdcsel(0) through pdcsel(5) are decoded from the upper bank address and pdcsel(6) –pdcsel(7) are decoded from the lower bank address.

The PDC selector 902 permits activation of two CAMs at the same time. This provides dual bank simultaneous operation. One CAM is selected from the upper bank group of CAMs, CAM 6–CAM7 and one CAM is selected from the lower bank group of CAMs, CAM0–CAM5.

The CAM cells 904 are non-volatile memory cells used as fuses. They are programmed to indicate that a certain address location is being replaced by a redundant address location. The CAM cells 904 labelled CAM0, CAM1, CAM2, CAM3, CAM4 and CAM5 in FIG. 9 are all associated with the upper bank of the core cell array. The CAM cells 904 labelled CAM6 and CAM7 are associated with the lower bank.

The upper bank CAM output circuit 906 and the lower bank CAM output circuit 908 receives the output of the CAM cells 904. The CAM cells 904 labelled CAM1 through CAM5 and associated with the upper bank are coupled to the upper bank CAM output circuit 906, which also receives the upper address UA. Similarly, the CAM cells 906 labelled CAM6 and CAM 7 and associated with the lower bank are coupled to the lower bank CAM output circuit 908, which also receives the lower bank address LA.

The upper bank CAM output circuit 906 and the lower bank CAM output circuit 908 each read the status of their associated CAM cells 904. In one embodiment, the CAM output circuit 906, 908 determine if the selected CAM cell 904 draws a predetermined current. Since, as noted, the CAM cells 904 are nonvolatile memory cells, when they are programmed in one state they draw a first predetermined current, such as 80 µA. When they are programmed in another state, they draw a second predetermined current, such as substantially 0 µA. Thus, the CAM output circuits 906, 908 act like sense amplifiers to detect the level of the CAM cell current. Other detection techniques for data detection, such as sensing a voltage stored in the CAM cells 904, may be used as well. The address received, either the upper bank address UA at the CAM output circuit 906 or the lower bank address LA at the CAM output circuit 908, determines which CAM cell 904 is sensed. The output of the CAM output circuits 906, 908 is a digital signal 922 indicative of the state of the sensed CAM cell 904.

The CAM output circuits 906, 908 may include a comparing circuit which compares the CAM status received from the CAM cells 904 with the upper bank address UA and the lower bank address LA. In that case, the output signal from the CAM output circuits 906, 908 corresponds to the result of the comparison between the CAM status and the input address.

The multiplexer 910 selects an input signal for enabling a read and/or a write operation to a redundant address. The multiplexer 910 receives a series of enable signals, including an upper bank read CAM enable signal 930, a lower bank read CAM enable signal 932, a upper bank write CAM enable signal 934 and a lower bank write CAM enable signal 936. A signal 922 is received from the upper bank CAM output circuit 906 to select a read signal 940 and a write signal 942. The read signal 940 is provided to the read redundant I/O decoder 912 and the write signal is provided to the write redundant I/O decoder 914.

The read redundant I/O decoder 912 and the write redundant I/O decoder 914 provide function-oriented signals labelled R_redio and W_redio. The signals R_redio control read operations involving redundant circuit elements. Similarly, the signals W_redio control write operations involving redundant circuit elements. In the illustrated embodiment, the signals REDIO_ELM0 and REDIO_ELM1 in FIG. 7 are equivalent to the signals R_redio in FIG. 9. FIG. 7 illustrates read operation only. However, the write operation is similar to read in terms of the redundancy function and extension of the design of FIG. 7 to write operation is well within the skill of those ordinarily skilled in the art. Thus, the signals REDIO_ELM0 and REDIO_ELM1 (R_redio) form redundancy control signals for controlling which redundancy element will be activate.

In general, the memory circuit 100 includes read path circuits and write path circuits. When a read operation is taking place, the read path circuits determine whether the location to be read is being replaced by a redundant address location. If so, then the data is read from the redundant address location instead. Similarly, if a write operation is taking place, the write path circuits determine whether the location to be written is being replaced by a redundant address location. If so, then the write is performed on the redundant write location instead of the regular addressed location.

Figure 10:
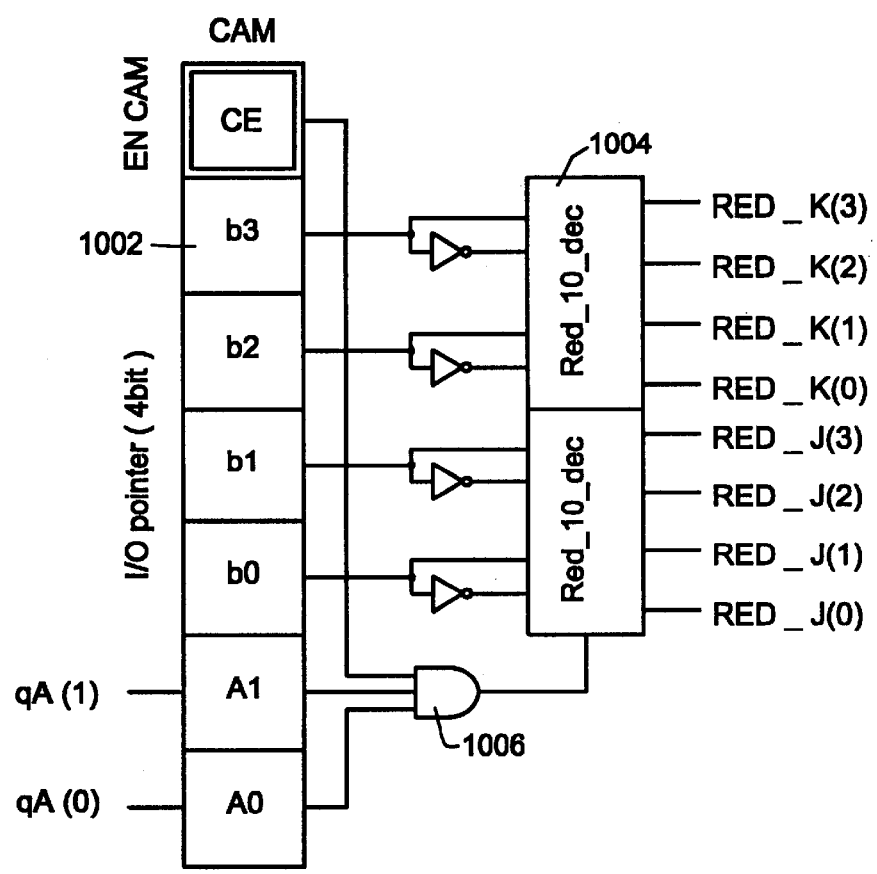
FIG. 10 is block diagram of a second implementation of a content addressable memory circuit for use in the memory circuit of FIG. 1.

FIG. 10 illustrates a second embodiment of the content addressable memory circuit 114 of FIG. 9. In FIG. 10, The CAM circuit 1000 includes CAM cells 1002, a decoder 1004, and an AND gate 1006. The CAM circuit is preferably included twice on the memory circuit 100 to provide redundancy control for both the upper and lower banks.

The CAM cells 1002 store seven bits per redundant element. Two bits labelled A0 and A1 are for word address comparison. Four bits labelled b0, b1, b2 and b3 form an I/O indicator, designating which of the I/O ($DQ_0$ through $DQ_{15}$) is associated with the redundant element. One bit labelled CE indicates whether the CAM is enabled.

The CAM cells 1002 are programmed as a last step in the manufacture and test of the memory circuit 100. As noted, the CAM cells 1002 are associated with a redundant element. The data stored in the CAM cells indicates which regular element the associated redundant element replaces. The CAM cells 1002 are presented with the current address information received at the address inputs 104 of the memory circuit 100 and a selected I/O indication. If there is a match between the data presented and the data stored in the CAM cells 1002, the inputs to the AND gate 1006 will all be high and the decoder 1004 will be enabled.

The decoders 1004 correspond to the decoder 912, 914 in FIG. 9. The decoder 1004 generates signals RED_J(0)–RED_J(3) and RED_K(0)–RED_K(3). A set of each of these signals is generated for both read redundancy elements and write redundancy elements.

In FIG. 10, each bit of the CAM 1002 corresponds functionally to circuitry in FIG. 9 including CAM cells 904, CAM output circuits 906, 908 and the multiplexer 910. The output of the CAM 1002 corresponds to the read signal 940 and the write signal 942 (FIG. 9). In the CAM 1002, the contents of the CAM cells A0 and A1 are compared with the upper and lower bank address bits qA0 and qA1, where the prefix q is U for the upper bank address and L for the lower bank address. When the address bits and the CAM data match, the CAM output for that bit becomes a logic 1. If the address A1, A0 outputs and the CAM enable CE output are all logic 1, the and gate 1006 will enable the decoder 1004.

The decoder 1004 in one embodiment operates according to the following truth table:

| 1006 | b3 | b2 | K(3) | K(2) | K(1) | K(0) |
|---|---|---|---|---|---|---|
| 0 | x | x | 0 | 0 | 0 | 0 |
| 1 | 0 | 0 | 0 | 0 | 0 | 1 |
| 1 | 0 | 1 | 0 | 0 | 1 | 0 |
| 1 | 1 | 0 | 0 | 1 | 0 | 0 |
| 1 | 1 | 1 | 1 | 0 | 0 | 0 |
| 1006 | b1 | b0 | J(3) | J(2) | J(1) | J(0) |
| 0 | x | x | 0 | 0 | 0 | 0 |
| 1 | 0 | 0 | 0 | 0 | 0 | 1 |
| 1 | 0 | 1 | 0 | 0 | 1 | 0 |
| 1 | 1 | 0 | 0 | 1 | 0 | 0 |
| 1 | 1 | 1 | 1 | 0 | 0 | 0 |

Here, 1006 refers to the output of the AND gate 1006. B0, b1, b2 and b3 refer to the outputs of the CAM cells 1002 storing those values for and I/O designator. K(n) and J(n), n=0, 1, 2, 3, correspond to the signals R_redio in FIG. 9 and the signals REDIO_ELM0 in FIG. 7.

Thus, the redundancy control circuit receives current address data at the PDC selector 902 (FIG. 9) or the CAM 1002 (FIG. 10). The address data may correspond to an upper bank address, a lower bank address or both. The address data is compared with stored redundancy data as maintained in the CAM cells 904 (FIG. 9) or the CAM 1002 (FIG. 10). If a redundant element should be selected, there will be a match with the stored data and appropriate control signals will be generated to select the redundant circuits. Circuits are replaced on an I/O-by-I/O basis.

From the foregoing, it can be seen that the present embodiments provide a memory circuit which features redundancy in a page mode device. The memory circuit includes an array of core cells including redundant core cells. Sense amplifiers associated with each column of core cells and redundant core cells may be individually selected. Word selection circuitry couples sense amplifiers to I/O of the memory circuit on by I/O basis. Thus, any bit of any word addressed in the memory circuit on a selected page can be individually replaced by a redundant element using the word selection circuitry.

While a particular embodiment of the present invention has been shown and described, modifications may be made. It is therefore intended in the appended claims to cover all such changes and modifications which fall within the true spirit and scope of the invention.

What is claimed is:

1. A memory circuit comprising:

address circuitry configured to receive address data;

output circuitry configured to provide a predetermined number of bits of stored data from the memory circuit;

a core cell array including a plurality of core cells and a plurality of redundant core cells;

sense amplifiers, including
      read sense amplifiers coupled to the core cells, and
      redundant sense amplifiers coupled to the redundant core cells; and word selecting circuitry coupled to the sense amplifiers and operative in response to the address data to couple a subset of the read sense amplifiers to the output circuitry, the word selecting circuitry inhibiting a failed read sense amplifier and coupling a redundant sense amplifier in place of the failed read sense amplifier.

2. The memory circuit of claim 1 wherein the core cell array comprises a first bank and a second bank, the sense amplifiers being shared by the first bank and the second bank.

3. The memory circuit of claim 1 wherein the output circuitry comprises a plurality of I/O buffers configured to provide the predetermined number of bits of stored data in a predetermined order.

4. The memory circuit of claim 3 wherein the word selecting circuitry is configured to couple a redundant sense amplifier in place of a failed redundant sense amplifier to an I/O buffer in an order identical to the predetermined order.

5. A memory circuit comprising:

address circuitry configured to receive address data corresponding to an addressed word of data to be accessed from the memory circuit;

a plurality of I/O buffers configured to communicate data externally to the memory circuit;

a core cell array including core cells and redundant core cells;

sense amplifiers, including
      read sense amplifiers associated with the core cells and configured to sense page data including the addressed word of data and a predetermined number of words of data; and
      redundant sense amplifiers associated with the redundant core cells; and word selection circuitry configured to couple sense amplifiers associated with the addressed word of data to the plurality of I/O buffers in response to the address data, the word selection circuitry further configured to couple a redundant sense amplifier to an I/O buffer in place of a failing bit of the core cell array and to inhibit a failed read sense amplifier associated with the failing bit.

6. A method for operating a memory circuit including a core cell array, the method comprising the steps of:

receiving address data corresponding to a word of data to be read from the core cell array;

reading page mode data including the word of data and a plurality of related words from the core cell array;

when the page mode data includes one or more failed bits, replacing only the one or more failed bits with redundant data; and in response to the address data, providing output data selected from the page mode data and the redundant data.

7. The method of claim 6 further comprising the steps of:

in response to additional address data, providing additional output data selected from one of the plurality of related words.

8. The method of claim 7 wherein the step of providing additional output data further comprises the steps of:

when the additional output data includes one or more failed bits, replacing the one or more failed bits with additional redundant data; and in response to the additional address data, providing the additional output data selected from the one of the plurality of related words and the additional redundant data.

9. The method of claim 6 wherein the replacing step comprises:

replacing any of the one or more failed bits with a redundant bit of data.

10. The method of claim 6 wherein the providing step comprises:

providing the redundant data in identical bit positions as the one or more failed bits.

11. The method of claim 6 wherein the providing step comprises:

providing a word of data including sixteen data bits arranged in predetermined order;

providing redundant bits in place of failed bits of the word of data, the redundant bits being positioned in identical order as the filed bits of the word of data.

* * * * *

UNITED STATES PATENT AND TRADEMARK OFFICE
CERTIFICATE OF CORRECTION

PATENT NO.   : 6,310,805 B1
DATED         : October 30, 2001
INVENTOR(S)  : Yasushi Kasa and Ming-Huei Shieh It is certified that error appears in the above-identified patent and that said Letters Patent is hereby corrected as shown below:

Inventors: Yasushi Kasa, Kawasaki (JP);
           Ming-Huei Shieh, Cupertino, CA (USA)

Signed and Sealed this

Eighteenth Day of June, 2002

*Attest:*

*Attesting Officer*

JAMES E. ROGAN
*Director of the United States Patent and Trademark Office*